(12) United States Patent
Yem et al.

(10) Patent No.: US 11,405,006 B1
(45) Date of Patent: Aug. 2, 2022

(54) AMPLIFYING CIRCUIT AND OPTICAL NAVIGATION DEVICE

(71) Applicant: PixArt Imaging Inc., Hsin-Chu (TW)

(72) Inventors: Poh Weng Yem, Penang (MY); Keng Yeam Chang, Penang (MY)

(73) Assignee: PixArt Imaging Inc., Hsin-Chu (TW)

( * ) Notice: Subject to any disclaimer, the term of this patent is extended or adjusted under 35 U.S.C. 154(b) by 0 days.

(21) Appl. No.: 17/225,128

(22) Filed: Apr. 8, 2021

(51) Int. Cl.
 *H03F 3/04* (2006.01)
 *G01J 1/44* (2006.01)
 *G01C 21/00* (2006.01)
 *H03K 19/20* (2006.01)

(52) U.S. Cl.
 CPC ............ *H03F 3/04* (2013.01); *G01C 21/00* (2013.01); *G01J 1/44* (2013.01); *H03K 19/20* (2013.01)

(58) Field of Classification Search
 CPC . H03K 19/20; G01C 21/00; G01J 1/44; H03F 3/04
 See application file for complete search history.

(56) References Cited

U.S. PATENT DOCUMENTS

| | | | |
|---|---|---|---|
| 9,609,259 B1* | 3/2017 | Tiew | H04N 5/378 |
| 2002/0158789 A1* | 10/2002 | Yoshioka | H03M 1/1215 341/156 |
| 2012/0198258 A1* | 8/2012 | Lye | G06F 1/3206 713/323 |
| 2015/0055802 A1* | 2/2015 | Tu | G06F 3/167 381/110 |
| 2020/0409444 A1* | 12/2020 | Delshadpour | H04L 25/0286 |

* cited by examiner

*Primary Examiner* — Georgia Y Epps
*Assistant Examiner* — Don J Williams
(74) *Attorney, Agent, or Firm* — Winston Hsu (57) ABSTRACT

An amplifying circuit, which can operate in one of a sample mode and a hold mode, comprising: an amplifier; a current providing circuit, configured to provide a first bias current to the amplifier in a power saving time interval when the amplifying circuit operates in the sample mode, and configured to provide a second bias current to the amplifier when the amplifying circuit operates in the hold mode; wherein the first bias current is smaller than the second bias current.

18 Claims, 12 Drawing Sheets

AMPLIFYING CIRCUIT AND OPTICAL NAVIGATION DEVICE

BACKGROUND OF THE INVENTION

1. Field of the Invention

The present invention relates to an amplifying circuit and an optical navigation device using the amplifying circuit, and particularly relates to an amplifying circuit with a lower power consumption and an optical navigation device using the amplifying circuit.

2. Description of the Prior Art

A conventional optical navigation device such as an optical mouse may comprise a plurality of amplifying circuits which comprise amplifiers consuming much power while operating. The more the amplifiers are, the greater the power consumption is. Such case may decrease the operating time of a battery of the optical navigation device.

Therefore, a new amplifying circuit with low power consumption is needed.

SUMMARY OF THE INVENTION

One objective of the present invention is to provide an amplifying circuit with lower power consumption.

Another objective of the present invention is to provide an optical navigation device with lower power consumption.

One embodiment of the present invention is to provide an amplifying circuit, which can operate in one of a sample mode and a hold mode, comprising: an amplifier; a current providing circuit, configured to provide a first bias current to the amplifier in a power saving time interval when the amplifying circuit operates in the sample mode, and configured to provide a second bias current to the amplifier when the amplifying circuit operates in the hold mode; wherein the first bias current is smaller than the second bias current.

In one embodiment, the above-mentioned amplifying circuit is provided in an optical navigation device and is configured to process optical sensing signals generated by an optical sensor of the optical navigation device.

In view of above-mentioned embodiments, the power consumption of the amplifying circuit can be reduced. Also, the electronic device using such amplifying circuit can have a longer battery operating time.

These and other objectives of the present invention will no doubt become obvious to those of ordinary skill in the art after reading the following detailed description of the preferred embodiment that is illustrated in the various figures and drawings.

DETAILED DESCRIPTION

Several embodiments are provided in following descriptions to explain the concept of the present invention. Each component in following descriptions can be implemented by hardware (e.g. a device or a circuit) or hardware with software (e.g. a program installed to a processor). Also, the following embodiments are only for examples, any circuit which can perform the same function should fall in the scope of the present invention. Besides, the method in following descriptions can be executed by programs stored in a non-transitory computer readable recording medium such as a hard disk, an optical disc or a memory. Besides, the term "first", "second", "third" in following descriptions are only for the purpose of distinguishing different one elements, and do not mean the sequence of the elements. For example, a first device and a second device only mean these devices can have the same structure but are different devices.

Figure 1:
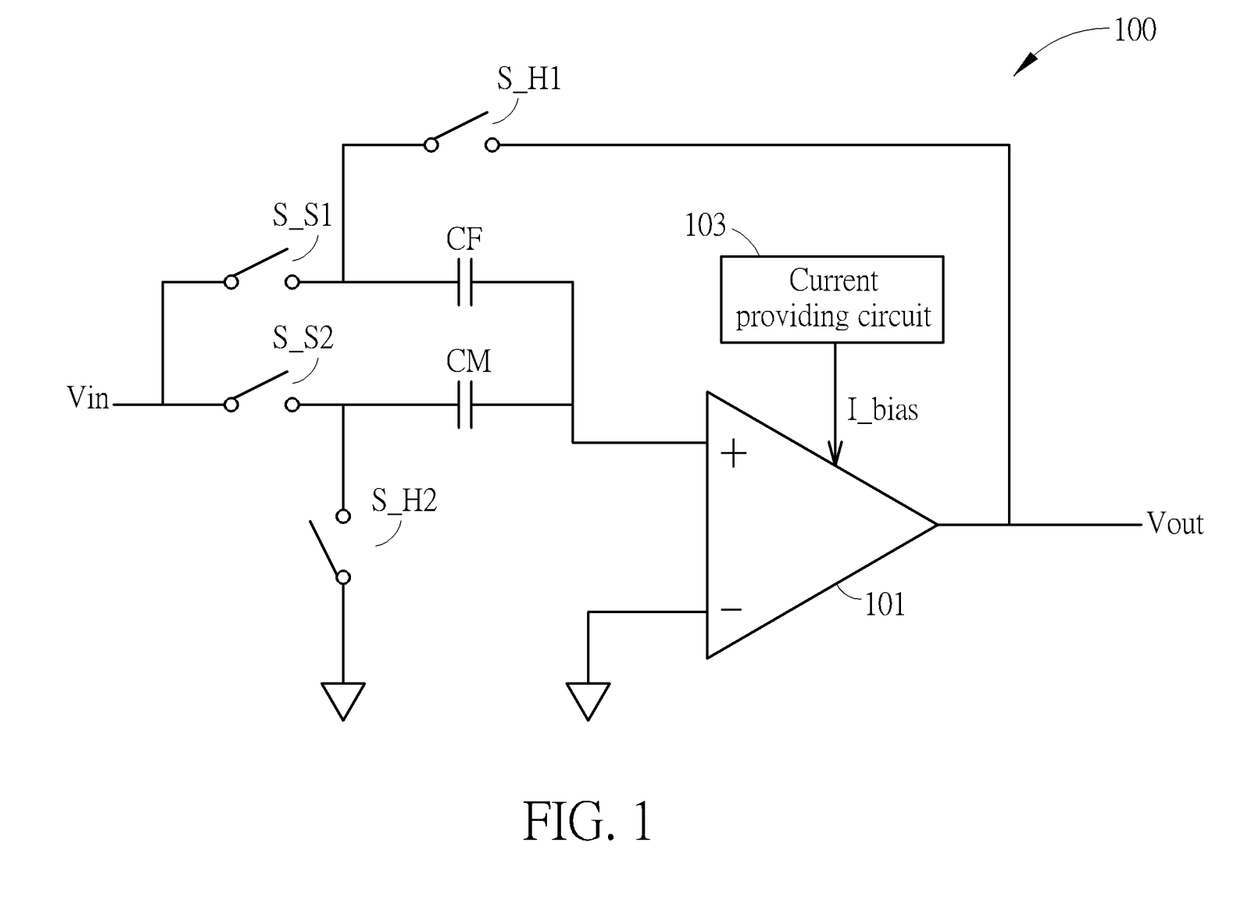
FIG. 1 is a circuit diagram of an amplifying circuit according to one embodiment of the present invention.

FIG. 1 is a circuit diagram of an amplifying circuit 100 according to one embodiment of the present invention. As illustrated in FIG. 1, the amplifying circuit 100, which can operate in one of a sample mode and a hold mode, comprises an amplifier 101, a current providing circuit 103, switches S_S1, S_S2, S_H1, S_H2 and capacitors CF, CM. The switches S_S1, S_S2 are turned on (conductive) but the switches S_H1, S_H2 are turned off (non-conductive) when the amplifying circuit 100 operates in the sample mode. In such case, the input voltage Vin can charge the capacitors CP and CM. On the contrary, the switches S_S1, S_S2 are turned off but the switches S_H1, S_H2 are turned on when the amplifying circuit 100 operates in the hold mode. The amplifier 101 receives a bias current I_bias generated by the current providing circuit 103, such that the components in the amplifier 101 can operate at proper conditions.

In one embodiment, the bias current I_bias is a first bias current in a power saving time interval when the amplifying circuit operates in the sample mode, and is a second bias current when the amplifying circuit operates in the hold mode. The first bias current is smaller than the second bias current. The amplifying circuit 100 is a switched capacitor amplifying circuit. However, the present invention is not limited to be applied to a switched capacitor amplifying circuit and is not limited to be applied to an amplifying circuit having a circuit structure illustrated in FIG. 1.

Figure 2:
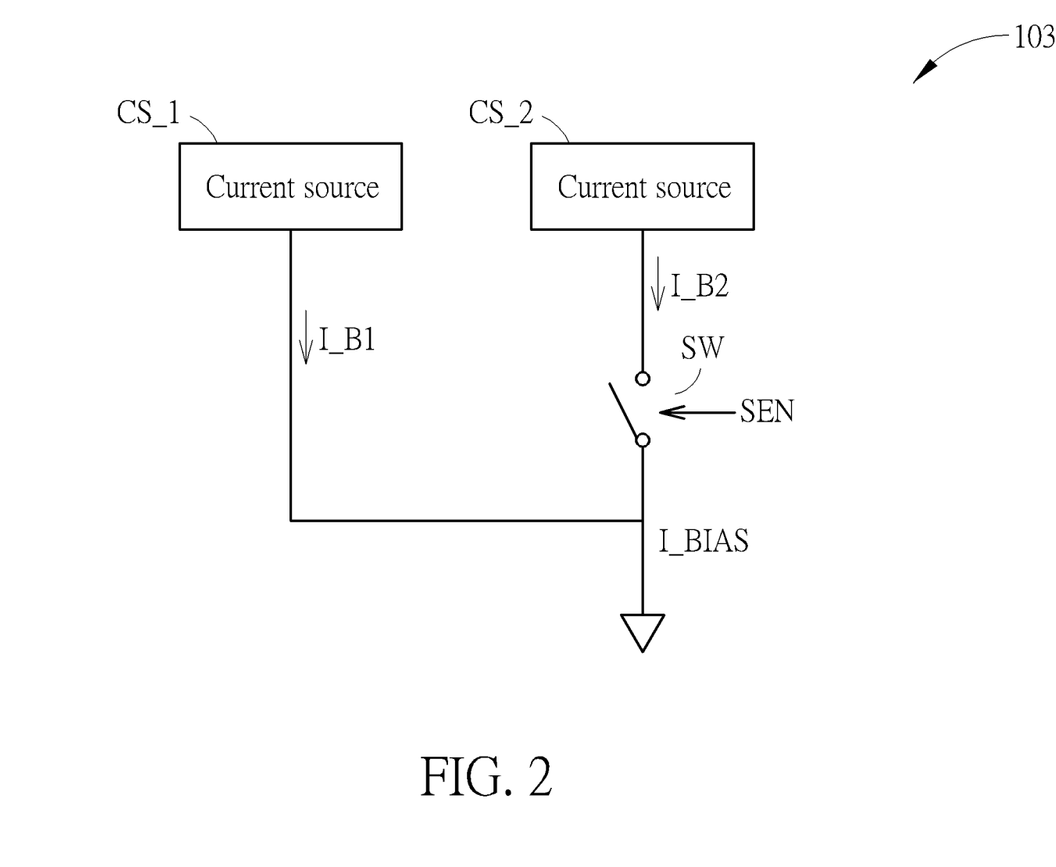
FIG. 2 is a block diagram illustrating a current providing circuit according to one embodiment of the present invention.

FIG. 2 is a block diagram illustrating a current providing circuit 103 according to one embodiment of the present invention. As illustrated in FIG. 2, the current providing circuit 103 comprises current sources CS_1, CS_2 and a switch SW. The current sources CS_1, CS_2 respectively generates currents I_B1 and I_B2. In the power saving time interval in the sample mode, the switch SW, which is controlled by a switch control signal SEN, is turned off, thus the bias current I_bias is the current I_B1 (the first bias current). Also, in the hold mode, the switch SW is turned on, thus the bias current I_bias equals I_B1+I_B2 (the second bias current).

Figure 3:
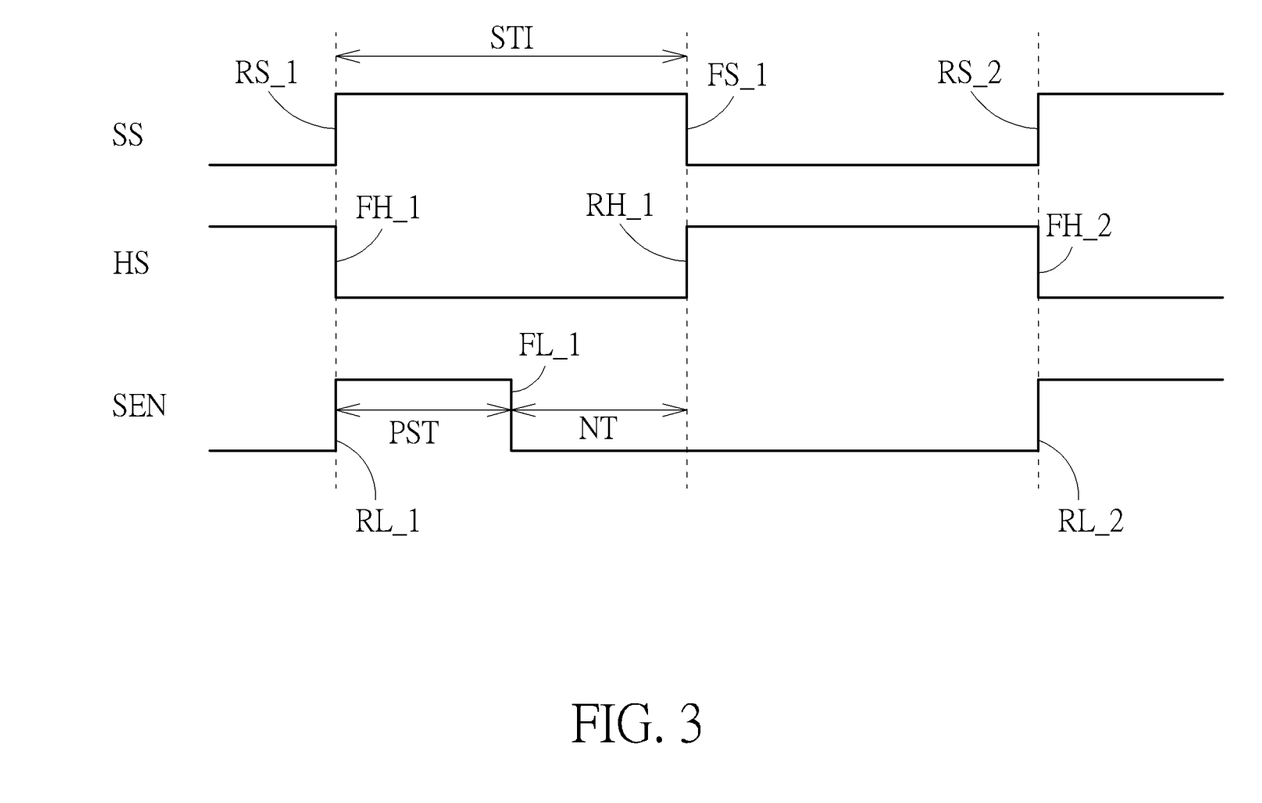
FIG. 3 and FIG. 4 are wave charts illustrating signals for controlling the amplifying circuit illustrated in FIG. 1 and the current providing circuit illustrated in FIG. 2, according to different embodiments of the present invention.
Figure 4:
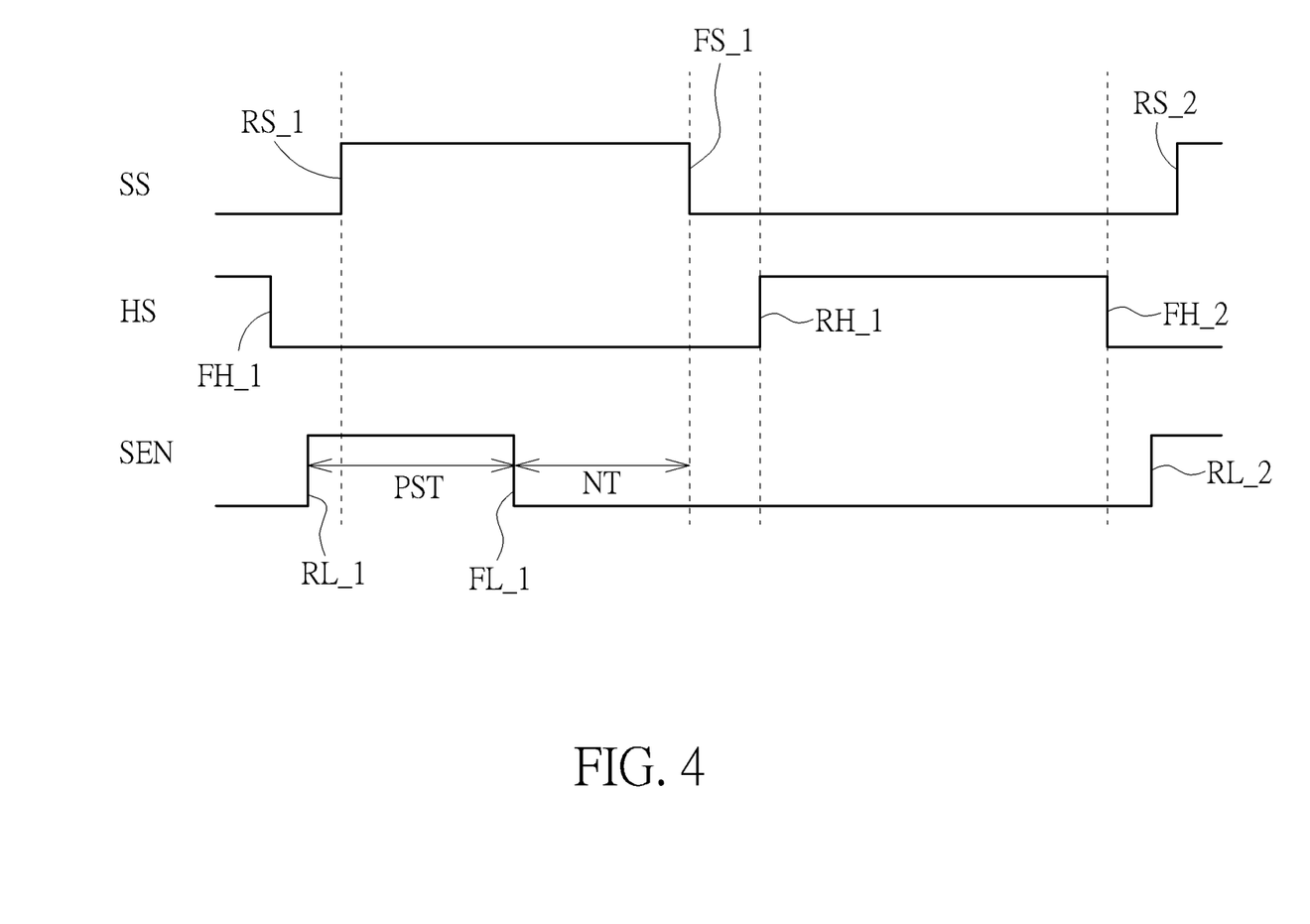

FIG. 3 and FIG. 4 are wave charts illustrating signals for controlling the amplifying circuit illustrated in FIG. 1 and the current providing circuit illustrated in FIG. 2, according to different embodiments of the present invention. In the embodiment of FIG. 3, a sample mode signal SS is used for controlling the switches S_S1 and S_S2 in FIG. 1, and a hold mode signal HS is for controlling the switches S_H1 and S_H2 in FIG. 1. The switches S_S1 and S_S2 are turned on when the sample mode signal SS has a high logic value (i.e. the sample mode) and are turned off when the sample mode signal SS has a low logic value. The switches S_H1 and S_H2 are turned on when the hold mode signal HS has a high logic value (i.e. the hold mode) and are turned off when the hold mode signal HS has a low logic value. Further, the switch SW in FIG. 2 is turned off when the switch control signal SEN has a high logic value (i.e. a power saving time interval PST), such that the bias current I_bias in FIG. 1 and FIG. 2 is the first bias current (I_B1). Oppositely, the switch SW in FIG. 2 is turned on when the switch control signal SEN has a low logic value, such that the bias current I_bias in FIG. 1 and FIG. 2 is the second bias current (I_B1+I_B2).

In view of the wave chart illustrated in FIG. 3, the amplifying circuit 100 operates in the sample mode during a sample time interval STI. The power saving time interval PST occupies only a portion of the sample time interval STI. Also, in one embodiment, the power saving time interval PST is inversely proportional to a speed that the amplifying circuit achieves a stable operating state. That is, if the amplifying circuit 100 can achieve the stable operating state in a short time (i.e. has a high speed), the power saving time interval PST can be set to be longer to save more power. On the contrary, if the amplifying circuit 100 needs more time to achieve the stable operating state (i.e. has a low speed), the power saving time interval PST needs to be shorter. The accomplishment of the sample operation can mean, for example, the capacitors CP and CM have already being charged to a voltage level of the input voltage Vin. The operation of "the amplifying circuit 100 achieve the stable operating state" can mean, for example, the amplifying circuit 100 accomplishes its DC biasing state.

Please refer to FIG. 3 again, since the power saving time interval PST occupies only a portion of the sample time interval STI, the sample time interval STI further comprises a normal power time interval NT. In one embodiment, the current providing circuit 103 also provides the second bias current to the amplifier 101 during the normal power time interval NT.

In the embodiment of FIG. 3, the rising edge RS_1 of the sample mode signal SS, the falling edge FH_1 of the hold mode signal HS and the rising edge RL_1 of the switch control signal SEN occur at the same time. Also, the falling edge FS_1 of the sample mode signal SS and the rising edge RH_1 of the hold mode signal HS occur at the same time. However, practically, time latency may exist between these edges. For example, as illustrated in FIG. 4, time latency exist between the rising edge RS_1 of the sample mode signal SS, the falling edge FH_1 of the hold mode signal HS and the rising edge RL_1 of the switch control signal SEN, and also exist between the falling edge FS_1 of the sample mode signal SS and the rising edge RH_1 of the hold mode signal HS. Such time latency may be particularly set for the smoothly operating of the amplifying circuit 100, or be caused by the limitation of components of the amplifying circuit 100. Such variation should also fall in the scope of the present application.

Figure 5:
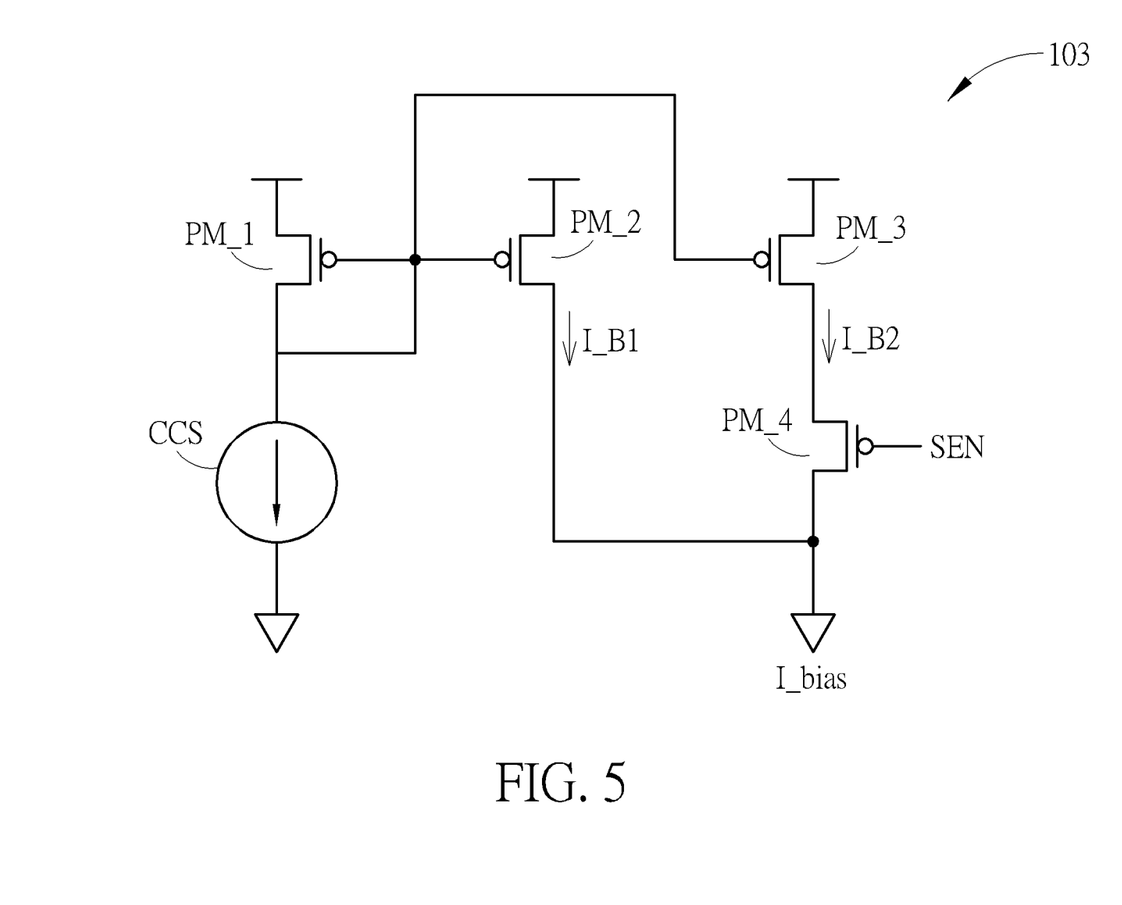
FIG. 5 and FIG. 6 are circuit diagrams illustrating detail circuits of the current providing circuit illustrated in FIG. 2.

The current providing circuit 103 in FIG. 2 can be implemented by various circuits. FIG. 5 is a circuit diagram illustrating detail circuits of the current providing circuit 103 illustrated in FIG. 2. As shown in FIG. 5, the current providing circuit 103, which is a current mirror circuit in this embodiment, comprises P-MOSFETs PM_1, PM_2, PM_3, PM_4 (the switch SW) and a constant current source CCS. The P-MOSFETs PM_1, PM_2, PM_3, PM_4 can be controlled to provide one the first bias current (I_B1) and the second bias current (I_B1+I_B2), and can be replaced by N-MOSFETs.

Figure 6:
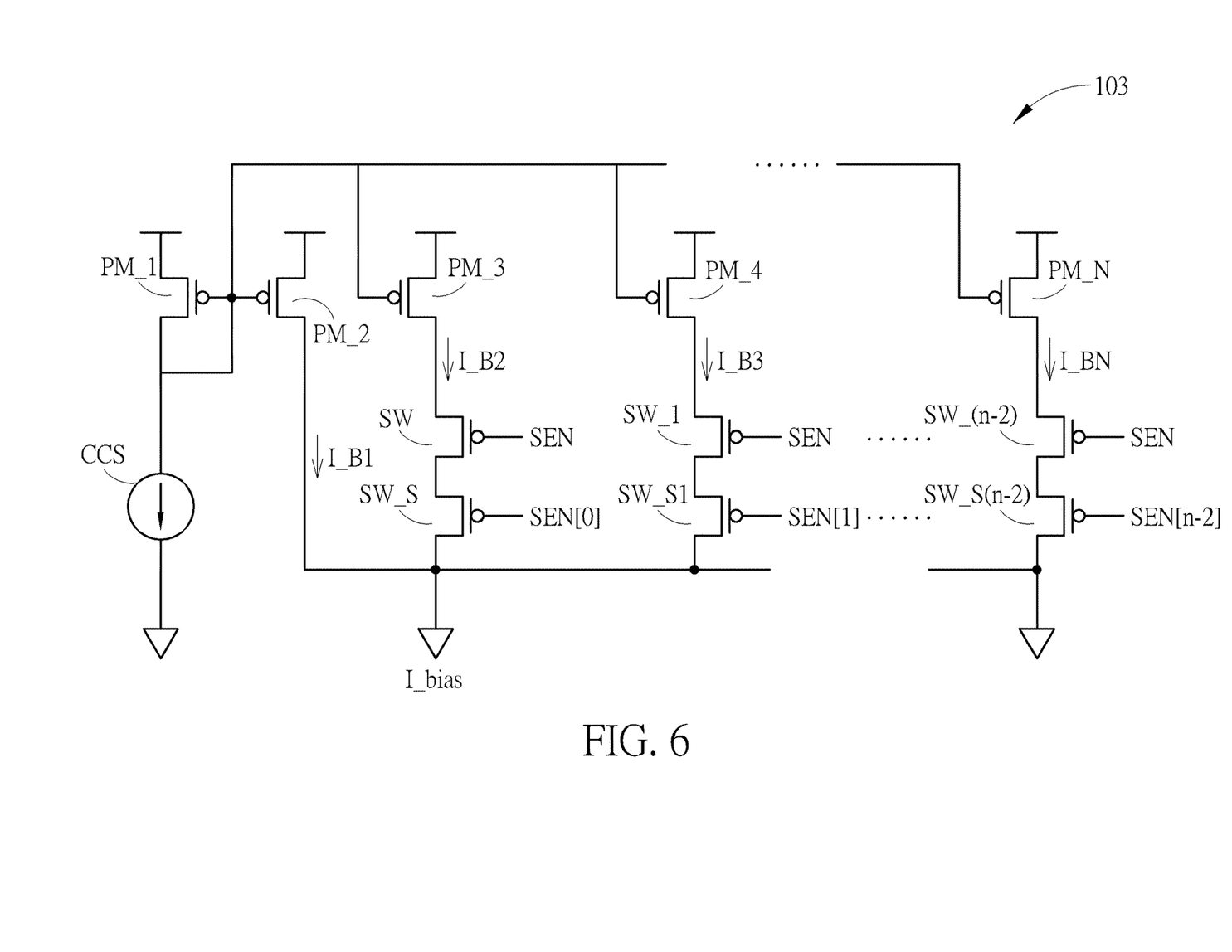

In the embodiments of FIG. 2 and FIG. 5, the current providing circuit 103 comprises two branches respectively providing the current I_B1 and the current I_B2. However, the current providing circuit 103 can comprises more than two branches. As shown in FIG. 6, the current providing circuit 103 comprise more than two branches formed by the constant current source CCS, PMOSFETs PM_1-PM_N, switches SW, SW_1 . . . SW_(n−2) and selection switches SW_S, SW_S1 . . . SW_S (n−2). The switches SW, SW_1 . . . SW_(n−2) are controlled by the switch control signal SEN, and the selection switches SW_S, SW_S1 . . . SW_S (n−2) are controlled by different bits of the selection signal SEN[0], SEN[1] . . . SEN[n−2]. Via control the switches SW, SW_1 . . . SW_(n−2) and the selection switches SW_S, SW_S1 . . . SW_S (n−2), the bias current I_BIAS can be any combination of the currents I_B1 . . . I_BN. Via such structure, the bias current I_bias can be further reduced in the power saving time interval PST if necessary, thus the power consumption can be further decreased.

Figure 7:
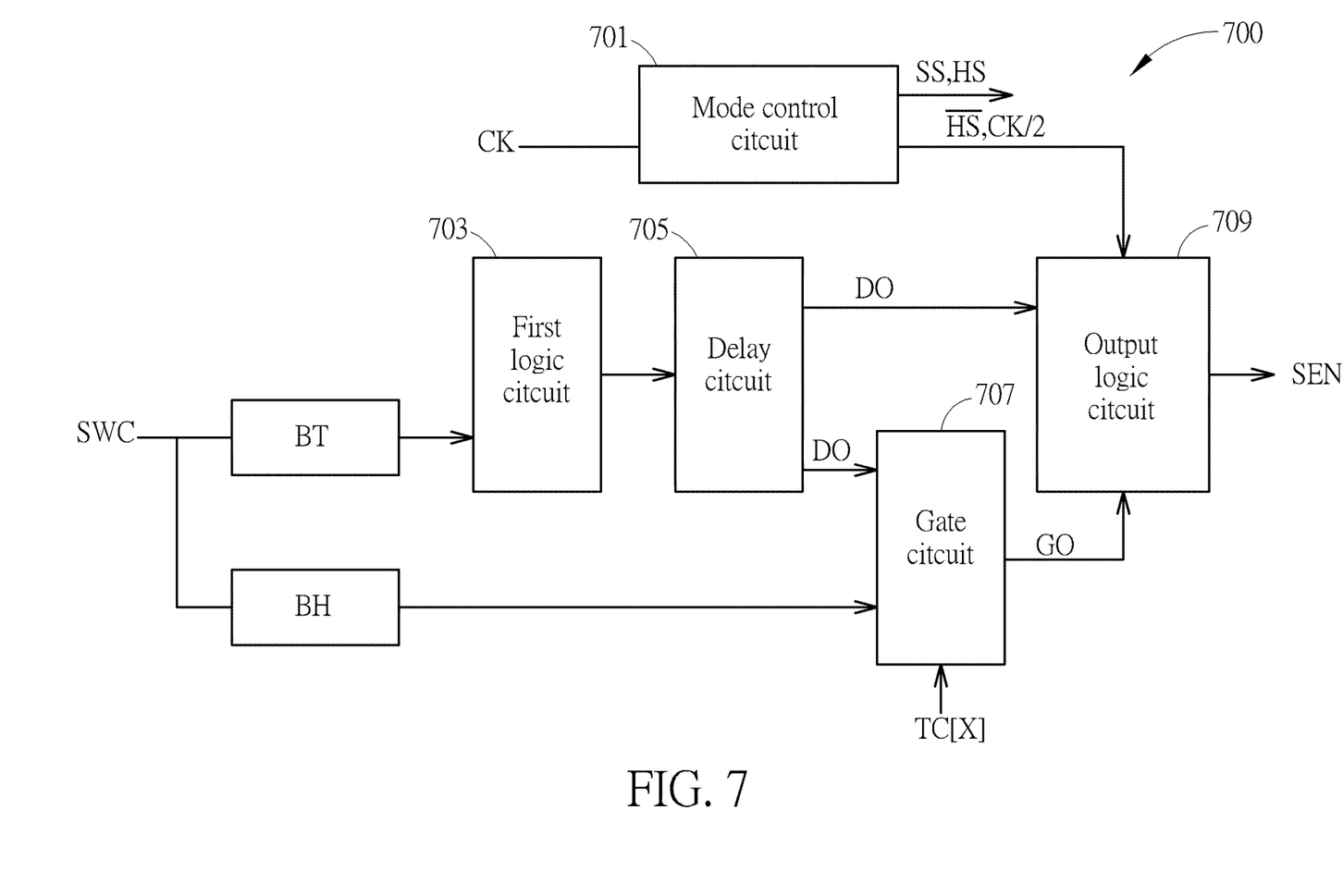
FIG. 7 is a block diagram illustrating a switch control signal generating circuit according to one embodiment of the present invention.

Many circuits can be applied to generate the switch control signal SEN. FIG. 7 is a block diagram illustrating a switch control signal generating circuit 700 according to one embodiment of the present invention. As illustrated in FIG. 7, the switch control signal generating circuit 700 comprises a binary to thermometer code converter BT, a binary to one hot code converter BH, a mode control circuit 701, a first logic circuit 703, a delay circuit 705, a gate circuit 707 and an output logic circuit 709.

The mode control circuit 701 is configured to receive a clock signal CK to generate the sample mode signal SS, the hold mode signal HS and an inverted and delayed hold mode signal $\overline{HS\_DLY}$ of the hold mode signal HS. The binary to thermometer code converter BT is configured to receive a switch control code SWC. The first logic circuit 703, which comprises at least one logic gate, is configured to receive an output signal of the binary to thermometer code converter BT. The delay circuit 705 is configured to receive an output signal of the first logic circuit 703. The binary to one hot code converter BH is configured to receive the switch control code SWC. The gate circuit 707 is configured to pass at least portion of output signals DO of the delay circuit 705 according to an output signal of the binary to one hot code converter BH and one bit TC[X] of the output signal of the binary to thermometer code converter BT. The output logic circuit 709 is configured to generate the switch control signal SEN according to the output signals DO of the delay circuit 705, output signals GO of the gate circuit 707, and the inverted and delayed hold mode signal $\overline{HS\_DLY}$.

Figure 8:
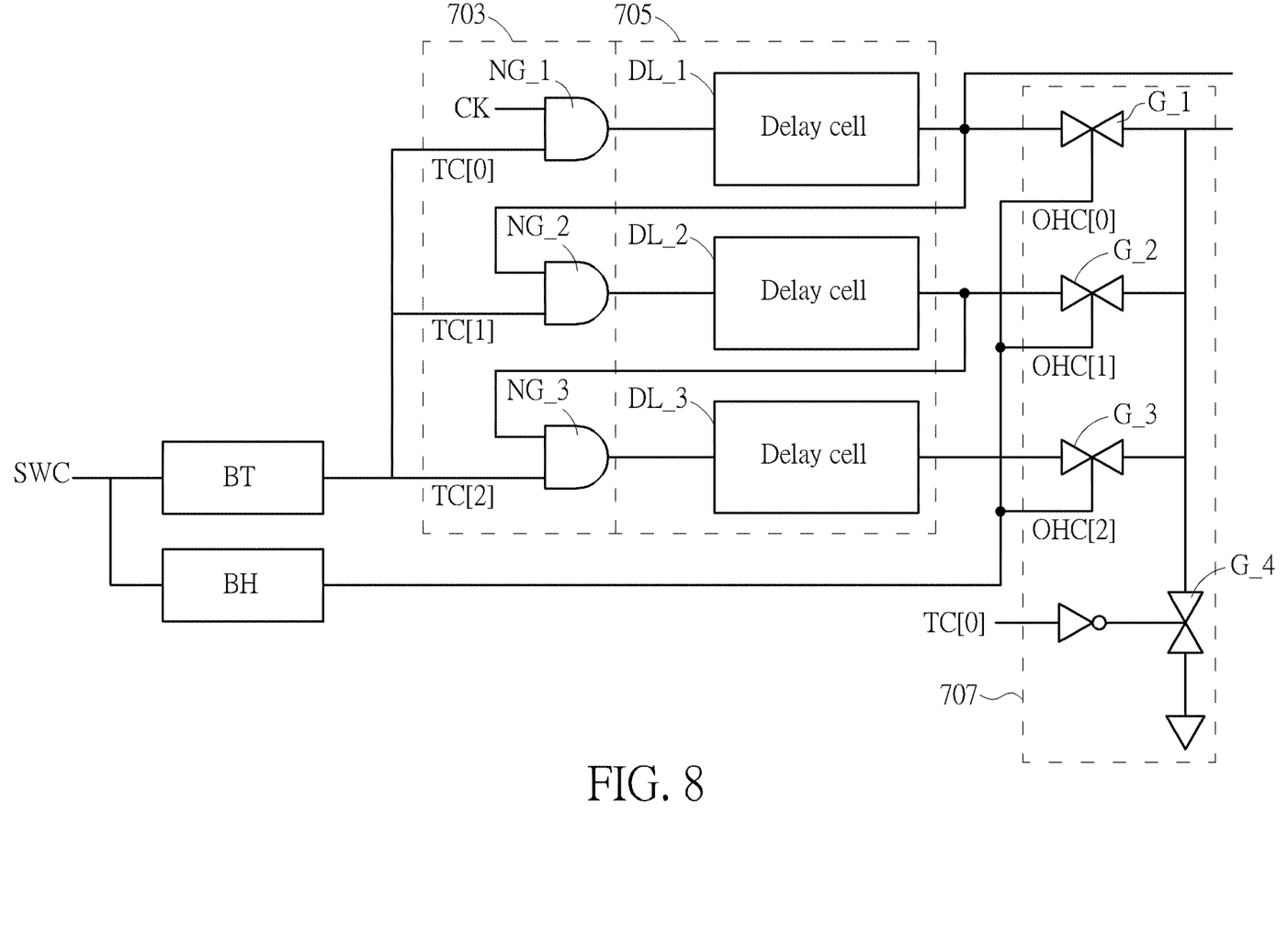
FIG. 8-FIG. 10 are circuit diagrams illustrating detail circuits of the switch control signal generating circuit illustrated in FIG. 7, according to embodiments of the present invention.
Figure 9:
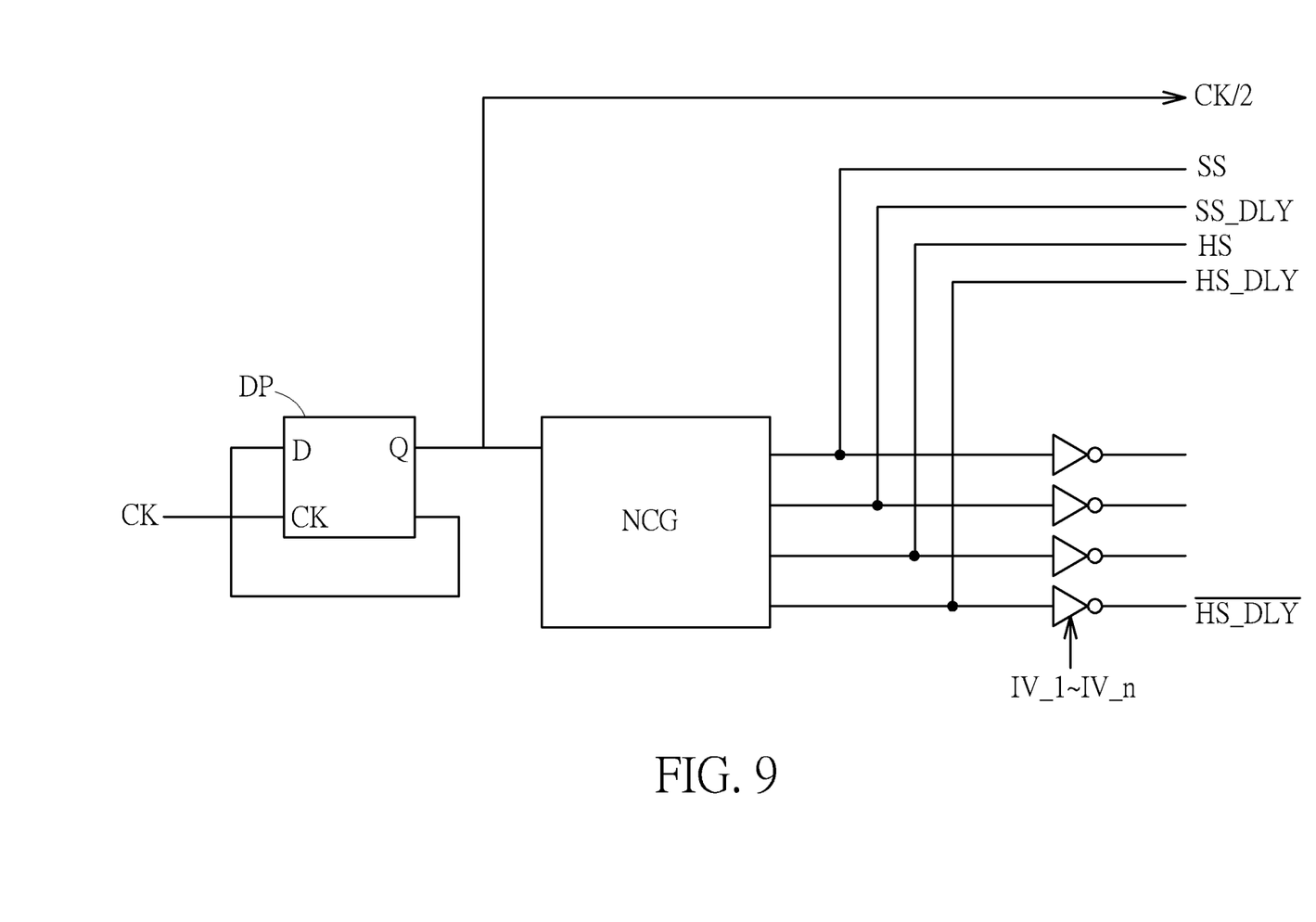
Figure 10:
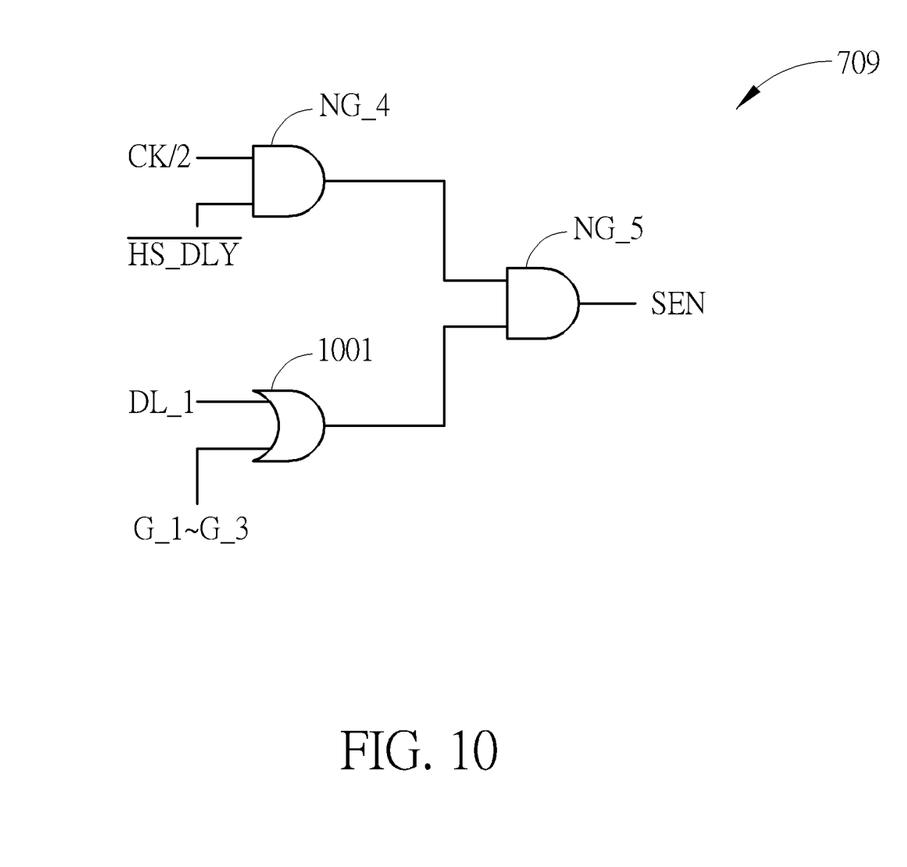

The blocks illustrated in FIG. 7 can be implemented by various circuits. FIG. 8-FIG. 10 are circuit diagrams illustrating detail circuits of the switch control signal generating circuit illustrated in FIG. 7, according to embodiments of the present invention. Please refer to FIG. 7 while referring to FIG. 8-FIG. 10, to understand the concept of the present invention for more clarity.

As shown in FIG. 8, the first logic circuit 703 comprises a plurality of AND gates NG_1-NG_3 to receive bits TC[0]-TC[2] of the output signal of the binary to thermometer code converter BT in parallel. Also, the delay circuit 705 comprises a plurality of delay cells DL_1-DL_2 configured to receive output signals of the AND gates NG_1-NG_3 in parallel. The gate circuit 707 comprises a plurality of gates G_1-G_4 controlled by different bits OHC[0]-OHC[2] of the output signal of the binary to one hot code converter BH. Also, the gate circuit 707 comprises a gate G_4 which receive an inverted value of the first bit TC[0] of the output signal of the binary to thermometer code converter BT.

More specifically, the first logic circuit 703 comprises a first AND gate NG_1, a second AND gate NG_2 and a third AND gate NG_3. The delay circuit 705 comprises a first delay cell DL_1, a second delay cell DL_2 and a third delay cell DL_3. The first AND gate NG_1 is configured to receive the clock signal CK and a first bit TC[0] of the output signal of the binary to thermometer code converter BT. The second AND gate NG_2 is configured to receive a second bit TC[1] of the output signal of the binary to thermometer code converter BT. The first delay cell DL_1 is coupled to an output of the first AND gate NG_1, and the second AND gate NG_2 further receives an output signal of the first delay cell DL_1. The connections between the third AND gate NG_3 and the second delay cell DL_2 are similar with which of the second AND gate NG_2 and the first delay cell DL_1, thus are omitted for brevity here. The third delay cell DL_3 is coupled between the third AND gate NG_3 and the gate G_3. The gates G_1-G_3 respectively receive output signals of the first delay cell DL_1, the second delay cell DL_2 and the third delay cell DL_3.

The binary to thermometer code converter BT and the binary to one hot code converter BH are converters to transfer a code to other codes, such that the following circuits can be controlled by inputs thereof. One example of relations between the bits TC[0]-TC[2] of the output signal of the binary to thermometer code converter BT, the bits OHC[0]-OHC[2] of the output signal of the binary to one hot code converter BH, and the switch control code is show in following Table 1. Persons skilled in the art can understand the details of the binary to thermometer code converter BT and the binary to one hot code converter BH, thus are omitted for brevity here.

TABLE 1

| SWC | | TC | | | OHC | | |
|---|---|---|---|---|---|---|---|
| [1] | [0] | [2] | [1] | [0] | [2] | [1] | [0] |
| 0 | 0 | 0 | 0 | 0 | 0 | 0 | 0 |
| 0 | 1 | 0 | 0 | 1 | 0 | 0 | 1 |
| 1 | 0 | 0 | 1 | 1 | 0 | 1 | 0 |
| 1 | 1 | 1 | 1 | 1 | 1 | 0 | 0 |

FIG. 9 is a circuit diagram illustrating the mode control circuit 701, according to one embodiment of the present invention. As illustrated in FIG. 9, the mode control circuit 701 comprises a D flip flop DP, a non-overlapping clock generator NCG and inverters IV_1-IV_n. The D flip flop DP is configured to perform frequency dividing to the clock signal CK, to generate a frequency divided clock signal CK/2 to the output logic circuit 709. The non-overlapping clock generator NCG is configured to generate the switch mode signal SS, the hold mode signal HS, a delayed switch mode signal SS_DLY, a delayed hold mode signal HS_DLY. One of the inverters IV_1-IV_n receives the delayed hold mode signal HS_DLY to generate the inverted and delayed hold mode signal $\overline{HS\_DLY}$. Details of the non-overlapping clock generator NCG are well known by persons skilled in the art, thus are omitted for brevity here.

FIG. 10 is a circuit diagram illustrating the output logic circuit 709, according to one embodiment of the present invention. As illustrated in FIG. 10, the output logic circuit 709 comprises a fourth AND gate NG_4, a fifth AND gate NG_5, and an OR gate 1001. The fourth AND gate NG_4 is configured to receive a frequency divided signal of the clock signal CK (i.e. the frequency divided clock signal CK/2), and to receive the inverted and delayed hold mode signal $\overline{HS\_DLY}$ The OR gate 1001 is configured to receive one of the output signals from the delay circuit 705, and configured to selectively receive the output signals from the gate circuit 707. Specifically, one input terminal of the OR gate 1001 selectively receive output signals from the first delay cell DL_1, the second delay cell DL_2 and the third delay cell DL_3 via the gates G_1-G_3 illustrated in FIG. 8, and the other input terminal of the OR gate 1001 receives the output signal from the first delay cell DL_1. The fifth AND gate NG_5 is configured to receive an output signal of the fourth AND gate NG_4 and an output signal of the OR gate 1001, to generate the switch control signal SEN.

Figure 11:
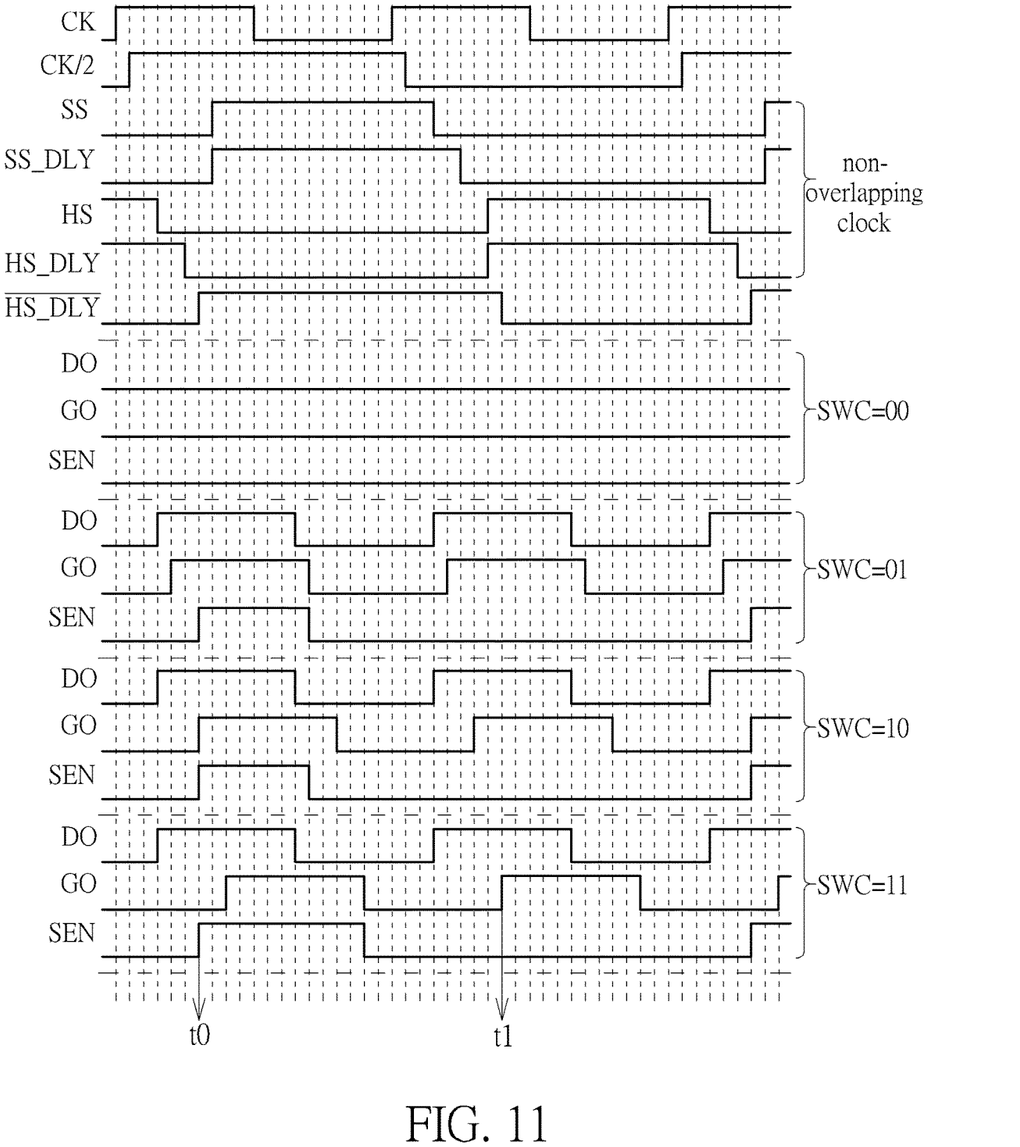
FIG. 11 is a circuit diagram illustrating the wave chart of the circuits illustrated in FIG. 8-FIG. 10.

FIG. 11 is a circuit diagram illustrating the wave chart of the circuits illustrated in FIG. 8-FIG. 10. More specifically, FIG. 11 illustrate the clock signal CK, the frequency divided clock signal CK/2, the sample mode signal SS, the delayed switch mode signal SS_DLY, hold mode signal HS, the delayed hold mode signal HS_DLY, the inverted and delayed hold mode signal $\overline{HS\_DLY}$, the output signals DO of the delay circuit 705, the output signals GO of the gate circuit 707, and the switch control signal SEN. As illustrated in FIG. 11, the output signals DO and the output signals GO change corresponding to different switch control codes SWC, thereby different switch control signals SEN can be generated. Therefore, the current provided by the current source in FIG. 2 can be changed via providing different switch control codes SWC.

Figure 12:
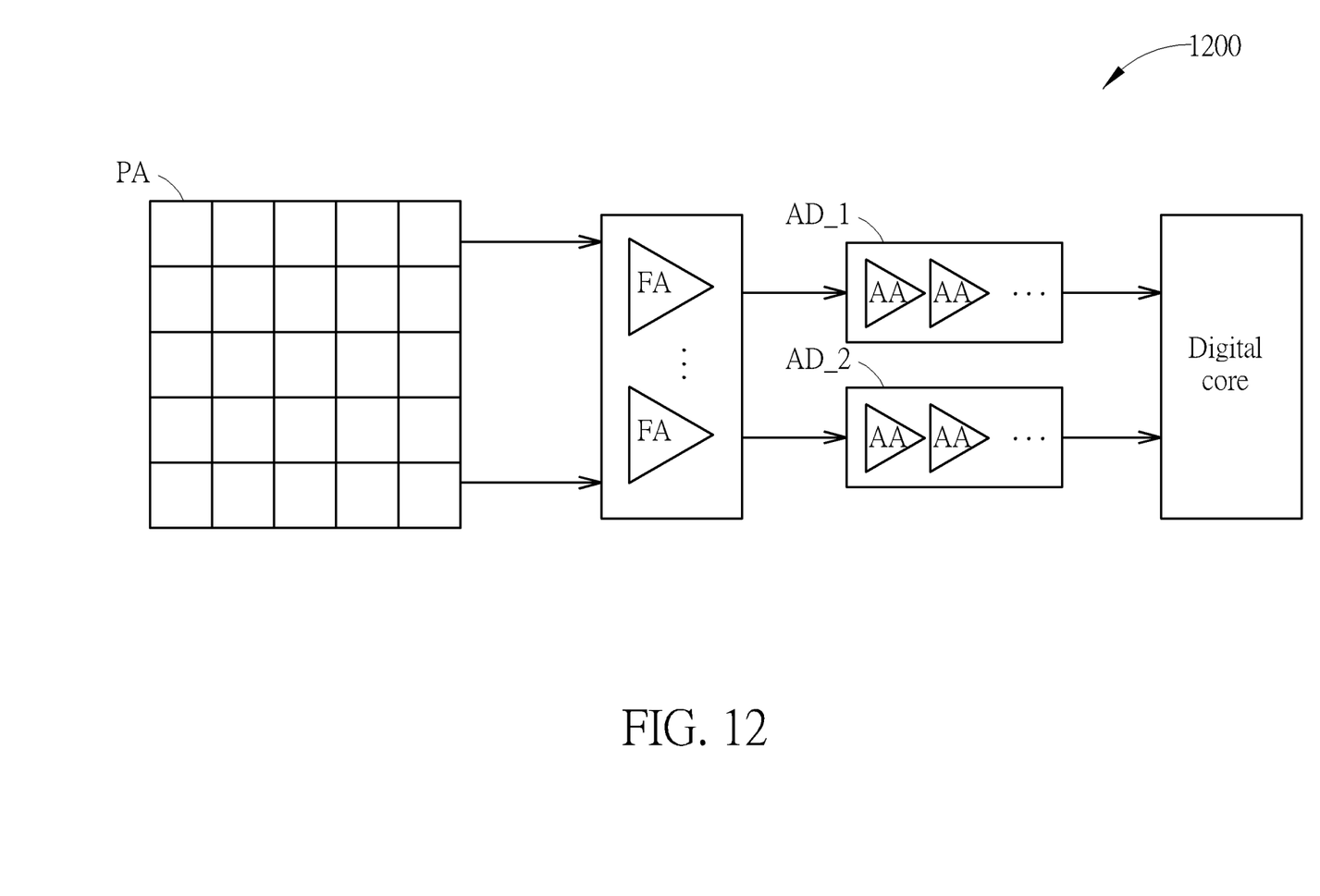
FIG. 12 is a block diagram illustrating an optical navigation device using the amplifying circuit provided by the present invention, according to one embodiment of the present invention.

The above-mentioned amplifying circuit can be applied to an optical navigation device, but not limited. FIG. 12 is a block diagram illustrating an optical navigation device 1200 using the amplifying circuit provided by the present invention, according to one embodiment of the present invention. As illustrated in FIG. 12, the optical navigation device 1200, such as an optical mouse or an optical touch sensing device, comprises a pixel array PA (i.e. an optical sensor), a plurality of front-end amplifiers FA (only two of them are illustrated), and a plurality of ADCs (analog to digital converters) AD_1, AD_2 (only two of them are illustrated). The pixel array PA is configured to sense optical data (e.g., image) to generate optical sensing signals, the front-end amplifiers FA and the amplifiers AA in the ADCs AD_1, AD_2 are configured to process the optical sensing signals.

The amplified and digitalized optical sensing signals are sent to the digital core for further processing. The optical navigation device 1200 can determine the relative location between the optical navigation device 1200 and an object (e.g., a table surface or a finger) according to the optical data sensed by the pixel array. Since the optical navigation device 1200 comprises a plurality of amplifying circuits, the power consumption can be significantly reduced if the amplifying circuits use the mechanism illustrated in above-mentioned embodiments. Therefore, the battery operating time of the optical navigation device 1200 can be extended. Such advantage is particularly obvious when the optical navigation device 1200 operates in a low power active mode.

In one embodiment, the current providing circuit 103 provides one of the first bias current (e.g., I_B1 in FIG. 2), the second bias current (e.g., I_B1+I_B2 in FIG. 2) and the third bias current (e.g., I_B2 in FIG. 2) to the amplifier in the amplifying circuits when the optical navigation device 1200 operates in an active mode. In the low power active mode, the optical navigation device 1200 does not require high quality of optical data to determine the relative location, the second bias current or the third bias current from the current providing circuit 103 can be deactivated Such operation can be implemented by the circuit illustrated in FIG. 6, but not limited. In one embodiment, the active mode means the optical navigation device 1200 operates with higher speed or require higher quality of optical data, and the low power active mode means the optical navigation device 1200 operates with lower speed or require lower quality of optical data.

In view of above-mentioned embodiments, the power consumption of the amplifying circuit can be reduced. Also, the electronic device using such amplifying circuit can have a longer battery operating time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A amplifying circuit, which can operate in one of a sample mode and a hold mode, comprising:
   an amplifier;
   a current providing circuit, configured to provide a first bias current to the amplifier in a power saving time interval when the amplifying circuit operates in the sample mode, and configured to provide a second bias current to the amplifier when the amplifying circuit operates in the hold mode;
   wherein the first bias current is smaller than the second bias current.

2. The amplifying circuit of claim 1, wherein the amplifying circuit operates in the sample mode during a sample time interval, wherein the power saving time interval occupies only a portion of the sample time interval and is inversely proportional to a speed that the amplifying circuit accomplishes its DC biasing state.

3. The amplifying circuit of claim 1, wherein the amplifying circuit operates in the sample mode during a sample time interval comprising the power saving time interval and a normal power time interval, wherein the current providing circuit provides the second bias current to the amplifier during the normal power time interval.

4. The amplifying circuit of claim 1,
   wherein the first logic circuit comprises a plurality of AND gates to receive bits of the output signal of the binary to thermometer code converter in parallel;
   wherein the delay circuit comprises a plurality of delay cells configured to receive output signals of the AND gates in parallel;
   wherein the gate circuit comprises a plurality of gates controlled by different bits of the output signal of the binary to one hot code converter.

5. The amplifying circuit of claim 4,
   wherein the first logic circuit comprises:
   a first AND gate, configured to receive the clock signal and a first bit of the output signal of the binary to thermometer code converter;
   a second AND gate, configured to receive a second bit of the output signal of the binary to thermometer code converter;
   wherein the delay circuit comprises:
   a first delay cell, coupled to an output of the first AND gate, wherein the second AND gate further receives an output signal of the first delay cell.

6. The amplifying circuit of claim 1, wherein the output logic circuit comprises:
   a fourth AND gate, configured to receive a frequency divided signal of the clock signal, and to receive the inverted and delayed hold mode signal;
   an OR gate, configured to receive one of the output signals from the delay circuit, and configured to selectively receive the output signals from the delay circuit via the gate circuit;
   a fifth AND gate, configured to receive an output signal of the fourth AND gate and an output signal of the OR gate, to generate the switch control signal.

7. An optical navigation device, comprising:
   an optical sensor, configured to sense optical data to generate optical sensing signals; and
   an amplifying circuit, configured to process the optical sensing signals and can operate in one of a sample mode and a hold mode, comprising:
   an amplifier; and
   a current providing circuit, configured to provide a first bias current to the amplifier in a power saving time interval when the amplifying circuit operates in the sample mode, and configured to provide a second bias current to the amplifier when the amplifying circuit operates in the hold mode; and
   a switch control signal generating circuit, comprising:
   a mode control circuit, configured to receive a clock signal to generate a sample mode signal, a hold mode signal and an inverted and delayed hold mode signal, wherein the amplifying circuit operates in one of the sample mode and the hold mode according to the sample mode signal and the hold mode signal;
   a binary to thermometer code converter, configured to receive a switch control code;
   a first logic circuit, configured to receive an output signal of the binary to thermometer code converter;
   a delay circuit, configured to receive an output signal of the first logic circuit;
   a binary to one hot code converter, configured to receive the switch control code;
   a gate circuit, configured to pass at least portion of output signals of the delay circuit according to an output signal of the binary to one hot code converter and one bit of the output signal of the binary to thermometer code converter; and
   an output logic circuit, configured to generate the switch control signal according to the output signals of the delay circuit, output signals of the gate circuit, and the inverted and delayed hold mode signal;
   wherein the current providing circuit comprises a switch controlled by the switch control signal, wherein the current providing circuit generates the first bias current when the switch is turned off and generates the second bias current when the switch is turned on;
   wherein the first bias current is smaller than the second bias current.

8. The optical navigation device of claim 7, wherein the amplifying circuit operates in the sample mode during a sample time interval, wherein the power saving time interval occupies only a portion of the sample time interval and is inversely proportional to a speed that the amplifying circuit accomplishes its DC biasing state.

9. The optical navigation device of claim 7, wherein the amplifying circuit operates in the sample mode during a sample time interval comprising the power saving time interval and a normal power time interval, wherein the current providing circuit provides the second bias current to the amplifier during the normal power time interval.

10. The optical navigation device of claim 7,
wherein the first logic circuit comprises a plurality of AND gates to receive bits of the output signal of the binary to thermometer code converter in parallel;
wherein the delay circuit comprises a plurality of delay cells configured to receive output signals of the AND gates in parallel;
wherein the gate circuit comprises a plurality of gates controlled by different bits of the output signal of the binary to one hot code converter.

11. The optical navigation device of claim 10,
wherein the first logic circuit comprises:
a first AND gate, configured to receive the clock signal and a first bit of the output signal of the binary to thermometer code converter;
a second AND gate, configured to receive a second bit of the output signal of the binary to thermometer code converter;
wherein the delay circuit comprises:
a first delay cell, coupled to an output of the first AND gate, wherein the second AND gate further receives an output signal of the first delay cell.

12. The optical navigation device of claim 7, wherein the output logic circuit comprises:
a fourth AND gate, configured to receive a frequency divided signal of the clock signal, and to receive the inverted and delayed hold mode signal;
an OR gate, configured to receive one of the output signals from the delay circuit, and configured to selectively receive the output signals from the delay circuit via the gate circuit;
a fifth AND gate, configured to receive an output signal of the fourth AND gate and an output signal of the OR gate, to generate the switch control signal.

13. The optical navigation device of claim 7,
wherein the current providing circuit provides one of the first bias current, the second bias current or a third bias current to the amplifier when the optical navigation device operates in an active mode;
wherein the current providing circuit does not provide the second bias current and the third bias current when the optical navigation device operates in a low power active mode.

14. A amplifying circuit, which can operate in one of a sample mode and a hold mode, comprising:
an amplifier; and
a current providing circuit, configured to provide a first bias current to the amplifier in a power saving time interval when the amplifying circuit operates in the sample mode, and configured to provide a second bias current to the amplifier when the amplifying circuit operates in the hold mode;
wherein the first bias current is smaller than the second bias current;
wherein the amplifying circuit operates in the sample mode during a sample time interval, wherein the power saving time interval occupies only a portion of the sample time interval and is inversely proportional to a speed that the amplifying circuit accomplishes its DC biasing state.

15. A amplifying circuit, which can operate in one of a sample mode and a hold mode, comprising:
an amplifier;
a current providing circuit, configured to provide a first bias current to the amplifier in a power saving time interval when the amplifying circuit operates in the sample mode, and configured to provide a second bias current to the amplifier when the amplifying circuit operates in the hold mode;
wherein the first bias current is smaller than the second bias current;
wherein the amplifying circuit operates in the sample mode during a sample time interval comprising the power saving time interval and a normal power time interval, wherein the current providing circuit provides the second bias current to the amplifier during the normal power time interval.

16. An optical navigation device, comprising:
an optical sensor, configured to sense optical data to generate optical sensing signals; and
an amplifying circuit, configured to process the optical sensing signals and can operate in one of a sample mode and a hold mode, comprising:
an amplifier; and
a current providing circuit, configured to provide a first bias current to the amplifier in a power saving time interval when the amplifying circuit operates in the sample mode, and configured to provide a second bias current to the amplifier when the amplifying circuit operates in the hold mode;
wherein the first bias current is smaller than the second bias current;
wherein the amplifying circuit operates in the sample mode during a sample time interval, wherein the power saving time interval occupies only a portion of the sample time interval and is inversely proportional to a speed that the amplifying circuit accomplishes its DC biasing state.

17. An optical navigation device, comprising:
an optical sensor, configured to sense optical data to generate optical sensing signals; and
an amplifying circuit, configured to process the optical sensing signals and can operate in one of a sample mode and a hold mode, comprising:
an amplifier; and
a current providing circuit, configured to provide a first bias current to the amplifier in a power saving time interval when the amplifying circuit operates in the sample mode, and configured to provide a second bias current to the amplifier when the amplifying circuit operates in the hold mode;
wherein the first bias current is smaller than the second bias current;
wherein the amplifying circuit operates in the sample mode during a sample time interval comprising the power saving time interval and a normal power time interval, wherein the current providing circuit provides the second bias current to the amplifier during the normal power time interval.

18. An optical navigation device, comprising:
an optical sensor, configured to sense optical data to generate optical sensing signals; and
an amplifying circuit, configured to process the optical sensing signals and can operate in one of a sample mode and a hold mode, comprising:
  an amplifier; and
  a current providing circuit, configured to provide a first bias current to the amplifier in a power saving time interval when the amplifying circuit operates in the sample mode, and configured to provide a second bias current to the amplifier when the amplifying circuit operates in the hold mode;
wherein the first bias current is smaller than the second bias current;
wherein the current providing circuit provides one of the first bias current, the second bias current or a third bias current to the amplifier when the optical navigation device operates in an active mode;
wherein the current providing circuit does not provide the second bias current and the third bias current when the optical navigation device operates in a low power active mode.

* * * * *